United States Patent [19]

Gill et al.

[11] Patent Number: 5,187,683
[45] Date of Patent: * Feb. 16, 1993

[54] METHOD FOR PROGRAMMING EEPROM MEMORY ARRAYS

[75] Inventors: Manzur Gill, Arcola; Sung-Wei Lin; Sebastiano D'Arrigo, both of Houston, all of Tex.

[73] Assignee: Texas Instruments Incorporated, Dallas, Tex.

[*] Notice: The portion of the term of this patent subsequent to Jan. 5, 2010 has been disclaimed.

[21] Appl. No.: 576,307

[22] Filed: Aug. 31, 1990

[51] Int. Cl.[5] ............................................. G11C 16/04
[52] U.S. Cl. .................................... 365/185; 365/218
[58] Field of Search .................. 365/104, 185, 189.01, 365/189.04, 189.06, 218, 233; 357/23.5, 23.6

[56] References Cited

U.S. PATENT DOCUMENTS

| 4,858,194 | 8/1989 | Terada et al. | 365/203 |
| 5,047,981 | 9/1991 | Gill et al. | 365/185 |
| 5,060,195 | 10/1991 | Gill et al. | 365/185 |

Primary Examiner—Joseph L. Dixon
Assistant Examiner—Jack A. Lane
Attorney, Agent, or Firm—Theodore D. Lindgren; Leo N. Heiting; Richard L. Donaldson

[57] ABSTRACT

A method is described for programming a semiconductor array of EEPROM cells. A selected cell is connected, by definition, to a selected source-column line, a selected drain-column line and a selected wordline. Each deselected memory cell in the array is connected to a deselected source-column line, a deselected drain-column line and/or a deselected wordline. The method includes preselecting first, second, third, fourth and fifth programming voltages such that the second programming voltage is more positive than the first programming voltage and such that the third, fourth and fifth programming voltages are intermediate between the first and second programming voltages. The first programming voltage is applied at least to a selected column line and to each of the same-type deselected column lines. The third programming voltage is applied to the selected wordline and the fourth programming voltage is applied to each deselected wordline. After a pre-charge time interval, the fifth programming voltage is applied to each same-type deselected column line and, after an optional additional pre-charge time interval, the second programming voltage is applied to the selected wordline. After a program time interval, the third programming voltage is applied to the selected wordline and, after an optional discharge time interval, the first programming voltage is applied to each same-type deselected column line. Each deselected wordline is maintained at the fourth programming voltage for an additional discharge time interval. The third, fourth and fifth programming voltages may have the same value.

24 Claims, 3 Drawing Sheets

METHOD FOR PROGRAMMING EEPROM MEMORY ARRAYS

BACKGROUND OF THE INVENTION

This invention relates to nonvolatile memory arrays, such as electrically-erasable, electrically-programmable, read-only-memory (EEPROM) arrays, and more particularly to a method for programming memory cells in such arrays in a manner that will not unintentionally de-program memory cells that have been previously programmed and that will not unintentionally program memory cells that are deselected.

EEPROMs, or electrically-erasable, electrically-programmable, read-only-memories, are field-effect devices having a floating-gate-type structure. An EEPROM floating gate is programmed by applying proper voltages to the source, drain and control gate of each cell, causing current to flow from a source or source-line through the gate insulator to the floating gate. Flash EEPROMs are EEPROMS that may be erased in bulk or in blocks instead of each cell being erased individually.

To reduce cell size and cost of manufacture, an EEPROM cell integrating a remotely located tunnelling area with a floating-gate transistor has recently been devised. The structural characteristics of the cell and its method of manufacture have been disclosed in U.S. patent application Ser. No. 07/219,529. This Application describes and claims a novel method for programming cells of the type disclosed as well as other types of non-volatile memory cells.

Prior-art programming procedures typically require that a preselected high voltage be placed on a selected wordline conductor connected to each memory cell in a row. Each wordline conductor is insulated from and disposed adjacent to a floating gate conductor of each cell in the respective row. Also, as in prior-art procedures, a preselected low programming voltage that is substantially less positive than the first programming voltage is placed on a selected one of a plurality of elongated semiconductor column lines formed at an angle to the wordlines, each memory cell in a column of memory cells being connected to a column line. In the selected memory cell at the intersection of the selected wordline conductor and the selected column line, electrons flow through a programming window insulator from the selected column line to the floating gate, programming the memory cell.

During the programming operation, previously programmed memory cells tend to become de-programmed. While programming methods have been disclosed in which voltages are applied to prevent such unintentional de-programming, those methods do not provide the necessary timing sequences for applying those voltages or provide the relative magnitudes of those voltages. The timing sequences are critical because the resistances and capacitances associated with wordlines and circuitry connected thereto generally differ from the resistances and capacitances associated with column lines and circuitry connected thereto. Furthermore, the resistances and capacitances of wordlines and column lines and circuitry connected thereto differ among themselves because of the different-length interconnections. Because the resistances and capacitances differ, the time constants associated with voltages applied to those wordlines and column lines differ. There is a need for an application sequence for voltages that will avoid unintentional de-programming of previously programmed cells, as well as avoid unintentional programming of deselected cells.

SUMMARY OF THE INVENTION

One aspect of the invention comprises a method for programming an EEPROM cell in an array of such cells in a manner that minimizes the tendency of deselected, pre-programmed cells to be erased and/or de-programmed, while at the same time preventing inadvertent programming of non-programmed, deselected cells.

This invention provides a method for programming selected memory cells in a semiconductor array of said cells. Each selected cell is connected to a selected source-column line, a selected drain-column line and a selected wordline. Each deselected memory cell in the array is connected to a deselected source-column line, a deselected drain-column line and/or a deselected wordline. The method includes preselecting first, second, third, fourth and fifth programming voltages such that the second programming voltage is more positive than the first programming voltage and such that the third, fourth and fifth programming voltages are intermediate between the first and second programming voltages. The first programming voltage is applied at least to one of the selected column lines and to each deselected same-type column line. The third programming voltage is applied to the selected wordline and the fourth programming voltage is applied to each deselected wordline. After a precharge time interval, the fifth programming voltage is applied to each deselected same-type column line and, after an optional additional pre-charge time interval, the second programming voltage is applied to the selected wordline. After a program time interval, the third programming voltage is applied to the selected wordline and, after an optional discharge time interval, the first programming voltage is applied to each deselected same-type column line. Each deselected wordline is maintained at the fourth programming voltage for an additional discharge time interval. The third, fourth and fifth programming voltages may have the same value.

The method of this invention is applicable to one-transistor, to split-gate transistor, and to two-transistor memory cell arrays utilizing Fowler-Nordheim tunnelling for programming. The tunnelling structure may be formed using well-known FLOTOX (Floating-gate, Tunnel-Oxide), MNOS (Metal-Nitride-Oxide-Silicon), or SONOS (Silicon-Oxide-Nitride-Oxide-Silicon) structures. Such cells typically have sources and drains that are electrically isolated from the sources and drains of adjacent cells.

BRIEF DESCRIPTION OF THE DRAWINGS

The novel features of this invention are set forth in the appended claims. The invention, its features, and its advantages are described below in conjunction with the following drawings:

DETAILED DESCRIPTION OF THE INVENTION

Figure 1:
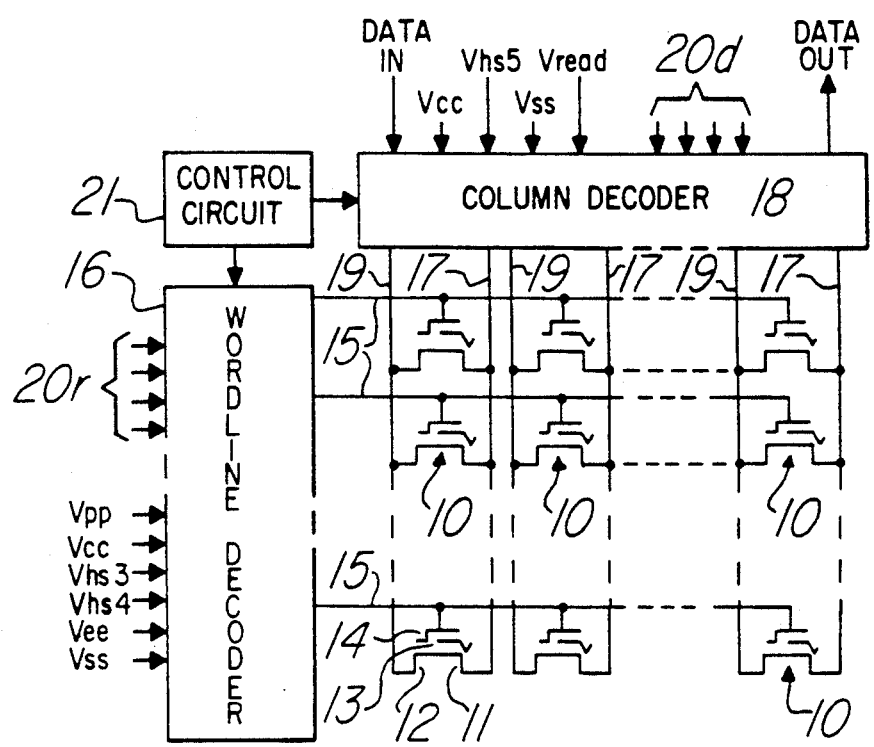
FIG. 1 is a representation of an array of memory cells and associated circuitry according to this invention.

Referring to FIG. 1, an example array of integrated-circuit memory cells is shown for the purpose of illustrating use of the method of this invention. Each cell is a floating-gate transistor 10 having a source 11, a drain 12, a floating gate 13 and a control gate 14. A control gate 14 of each cell 10 in a row is connected to a wordline 15, and each of the wordlines 15 is connected to a wordline decoder 16. A source 11 of each cell 10 in a column is connected to a source-column line 17, and each of the source-column lines 17 is connected to a column decoder 18. A drain 12 of each cell 10 in a column is connected to a drain-column line 19, and each of the drain-column lines 19 is connected to the column decoder 18.

Figure 2:
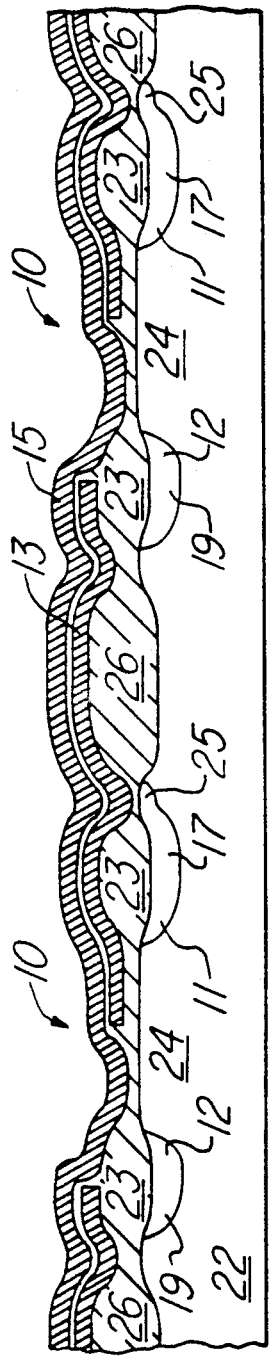
FIG. 2 is a greatly enlarged sectional view of a portion of an EEPROM array.
Figure 3:
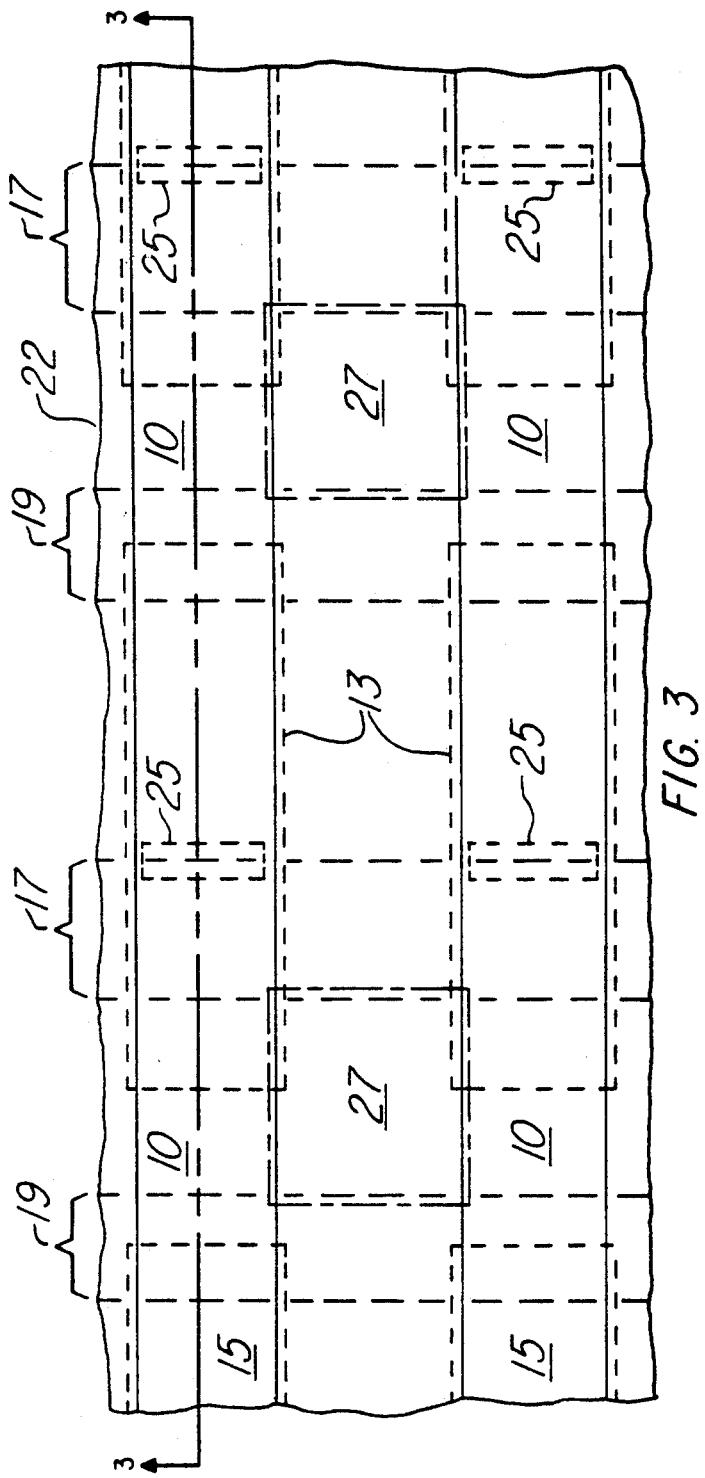
FIG. 3 is a plan view of a small portion of an EEPROM array, with the sectional view shown in FIG. 2, the sectional view of FIG. 2 taken substantially along line 3—3 of FIG. 3.

Referring to FIGS. 2 and 3, and particularly to FIG. 3, a plan view of a small section of an electrically-erasable, electrically-programmable, read-only-memory array is shown. A plurality of memory cells 10 are shown formed at a face of the semiconductor layer 22 in rows and columns. Each row of cells 10 has diffused into the substrate 22 an elongate source-column line 17 including source regions 11, buried under a relatively thick oxide region 23. Also diffused into the substrate 22, for each source region 11, is an elongate diffused drain-column line 19 including drain regions 12 that runs in parallel in a longitudinal direction to source-column line 17. Drain region 12 is also buried under a relatively thick oxide region 23.

For each cell 10, a floating gate conductor 13, identified by a dashed rectangle, is provided. Floating gate 13 is insulated from and disposed over a part of channel region 24 (FIG. 2), and is also formed as an elongate horizontal strip extending over the respective source region 11 and extending over the drain-column line 19 associated with the next adjacent cell 10. Each cell 10 further has a tunnel window 25 shown by a dotted outline that is underneath its respective floating gate conductor. Each tunnel window 25 can, for example, be as long as the width of the wordline conductor 15 under which it resides. The tunnel windows may be located adjacent to the channel area, rather than at the illustrated remote location. The tunnel oxide of such tunnel windows is typically on the order of 100 Angstroms in thickness.

The horizontal (as seen in FIG. 3) edges of each floating gate conductor 13 are aligned with a respective wordline conductor 15; the illustrated offset between edges is for the purpose of clarity only. Each row of cells 10 has a wordline conductor 15 extending over and across it in a horizontal direction.

The coupling between the control gate conductor 14 and the respective floating gate conductors 13 is enhanced because each floating gate conductor 13 extends completely across the corresponding bitline 17 and over an oxide isolating area 26 as well. Therefore, a larger fraction of the programming/erasing voltages applied to the control gate or wordline conductor 15 on any row of cells 10 will appear between the floating gate conductor 13 and the underlying source 11 or bitline 17.

The floating gate conductor 13 is typically spaced from the wordline conductor 15 by an oxide-nitride-oxide insulator layer on the order of 300 Angstroms equivalent oxide thickness.

In one embodiment, an area 27, represented in FIG. 3 as a dashed enclosure, is used to isolate cells 10 from one another in vertical direction, as well as to isolate the source 11 and drain 12 of a given cell 10 between word-lines 15. This area 27 may be a thick field oxide layer similar to field oxide regions 26 as shown in FIG. 2. Alternatively, each area 27 may be implanted with a P-type impurity to provide junction isolation between adjacent wordlines 15 and between channels 24 of cells 10 in the column-line direction.

As is well-known, in many cell configurations the regions designated source 11 and drain 12 of memory cells 10 may be interchanged. Also, in cell structures other than the example described herein, Fowler-Nordheim tunnelling for programming and/or erasing may take place between a drain 12 region and a floating-gate conductor 13 instead of between a source 11 region and a floating-gate conductor 13. Therefore, the terms "source" and "drain" as used herein are to be considered as interchangeable.

Although not shown in the FIGS. 2 and 3, a cap oxide and a sidewall oxide may be formed on the exposed polysilicon surfaces to improve data retention.

The cells 10 of FIGS. 1-4, although illustrated as split-gate type, may be one-transistor, two-transistor, SONOS or MNOS type. The cells 10 of FIGS. 1-4 are shown connected with separate source-column lines 17 for each column of sources 11 and with separate drain-column lines 19 for each column of drains 12, although this invention is not limited to that type of connection or that type of structure.

During a flash-erase mode, the column decoder 18 functions, for example, to apply a positive voltage Vcc (approximately +5 volts) to all the source-column lines 17. The column decoder 18 also functions to leave all drain-column lines 19 floating. The wordline decoder 16 functions to apply a high negative voltage Vee (approximately −11 volts) to all the wordlines 15. Excess electrons are removed from the floating gates 13 to erase the programmed cells 10.

In the read mode, the wordline decoder 16 functions, in response to wordline address signals on lines 20r and to a signal from read/write/erase control circuit 21, to apply a preselected positive voltage Vread (approximately +3 to +5 volts above Vss) to the selected wordline 15 (and the selected control gate 14), and to apply a low voltage (ground or Vss) to deselected wordlines 15. Control circuit 21 may be included in a microprocessor located on a separate integrated circuit from the memory circuit array. The column decoder 18 functions, in response to column address signals on lines 20d, to apply a preselected positive voltage Vsen (approximately +1 to +1.5 volts above Vss) to the selected drain-column line 19. The column decoder 18 also functions to connect all source-column lines 17 to ground (or Vss). The conductive or nonconductive state of the cell 10 connected to the selected drain-column line 19 and the selected wordline 15 is detected by a sense amplifier (not shown) connected to the DATA OUT terminal.

In a basic write or program mode, column decoder 18, in response to signals on lines 20d and to a signal from control circuit 21, functions to place first preselected programming voltage (reference potential Vss, which may be ground or a non-positive voltage) on selected source-column line 17, including a selected source 11 region. The wordline decoder 16 functions, in response to wordline address signals on lines 20r and to a signal from control circuit 21, to place a second preselected programming voltage Vpp (approximately +16 to +18 volts above Vss) on a selected wordline 15, including a selected control gate 14. The first preselected programming voltage Vss must differ sufficiently from the second preselected programming voltage Vpp that excess electrons will migrate, perhaps by Fowler-Nordheim tunnelling, to the selected floating-gate 13 and, as a result, program that selected floating-gate 13.

Figure 4:
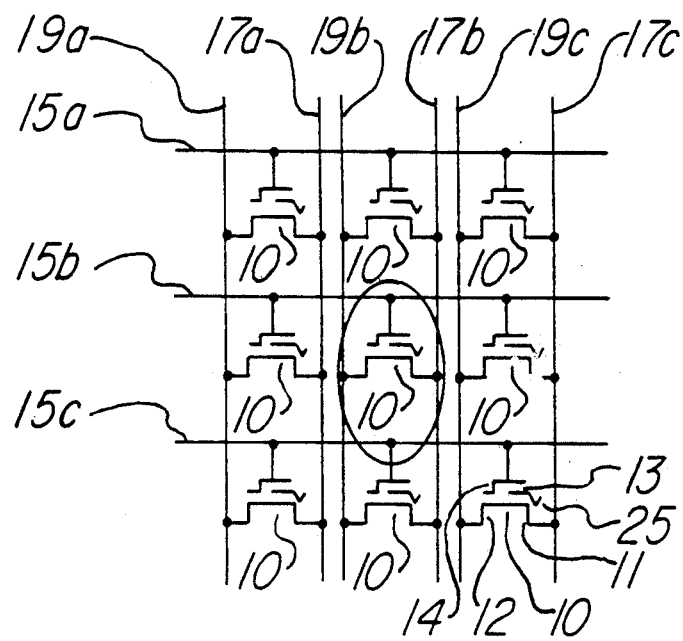
FIG. 4 is a schematic electrical diagram of a small portion of the EEPROM array illustrated in FIGS. 1, 2 and 3; illustrating the programming procedure of this invention.

Referring now to FIG. 4, which is a schematic electrical diagram of a 3×3 portion of an array of EEPROM cells 10 according to the invention, with like parts being identified by like numbers throughout FIGS. 1-4. Reference may also be made to FIGS. 2 and 3 for the physical structure involved. While the cells 10 in FIG. 4 are represented by a symbol commonly used for split-gate cells with a Fowler-Nordheim tunnelling window, that type of cell is merely representative of the types of cells that may be used with the method of this invention. Such cells 10 include, for example, one-transistor cells and two-transistor cells.

To program the selected (circled) memory cell 10 of FIG. 4, the selected source-column line 17b has the first programming voltage Vss of 0 volts applied to it. If the second programming voltage Vpp in the range of sixteen to eighteen volts is applied to the selected wordline 15b as in prior-art programming procedures, an electric potential difference of about sixteen to eighteen volts occurs between the source region 11 and the control gate 14 of the selected cell 10. The length of time that both first and second programming voltages are applied may be, for example, approximately 10 milliseconds. If the cell 10 has a capacitive coupling coefficient of about 0.7 to 0.8 between the wordline conductor 15b and the floating gate conductor 13, a programming potential of about twelve to thirteen volts can exist between the floating gate conductor 13 and the source-column line 17b. In the EEPROM cell 10 as described, this is sufficient to cause electrons to flow from the source region 11 across the programming window 25 into floating gate conductor 13 by means of Fowler-Nordheim tunneling through an oxide of about 100 Angstroms thickness. As explained in U.S. patent application Ser. No. 07/402,399, also assigned to Texas Instruments Incorporated, an intermediate voltage Vhs5 is applied to deselected source-column lines 17a and 17c to prevent the deselected cells 10 connected to selected wordline 15b from being programmed. If voltage Vhs5 is chosen within the range of six to seven volts, after capacitive coupling has been taken into account, the difference in potential between the floating gate conductor 13 and the non-selected source regions 11 of the non-selected cells 10 connected to selected wordline 15b is only about 4 to 6 volts during programming, which is insufficient to cause significant Fowler-Nordheim tunneling across the tunnel oxide windows 25 of those non-selected cells 10.

During programming, the drain-column line 19b associated with the source-column line 17b may be allowed to float, allowing no drain-to-source current in the cell 10 that is being programmed.

Many of the non-selected cells 10 connected to the deselected wordline 15 have floating gate conductors 13 that may have been previously programmed. Each such previously programmed cell 10 may have a negative charge on its floating gate resulting in an electric potential in the range of negative two to negative four volts residing thereon. Because each of the non-selected source-column lines 17a and 17c has six to seven volts (Vhs5) impressed thereon, the programmed cells may be inadvertently erased or partially erased. To counteract this "bitline stress" condition, the non-selected wordlines 15a and 15c have a second non-programming voltage Vhs4 previously impressed thereon, the voltage Vhs4 acting to dilute the electric field across the tunnel oxide windows 25. This voltage Vhs4, also discussed in the foregoing patent application, is also selected to be between the first and second programming voltages, and may be slightly greater than the first programming voltage. In the illustrated embodiment, this Vhs4 voltage is selected in the range of 7 to 9 volts.

The sequence of application and removal of the intermediate voltages is of critical importance if de-programming of programmed cells 10 is to be avoided. In accordance with this invention, the selected wordline 15b is pre-charged to a voltage Vhs3 and the deselected wordlines 15a and 15c are pre-charged to a voltage Vhs4 prior to application of voltage Vhs5 to deselected source-column lines 17a and 17c and prior to application of the programming voltage Vpp to wordline 15b.

Figure 5:
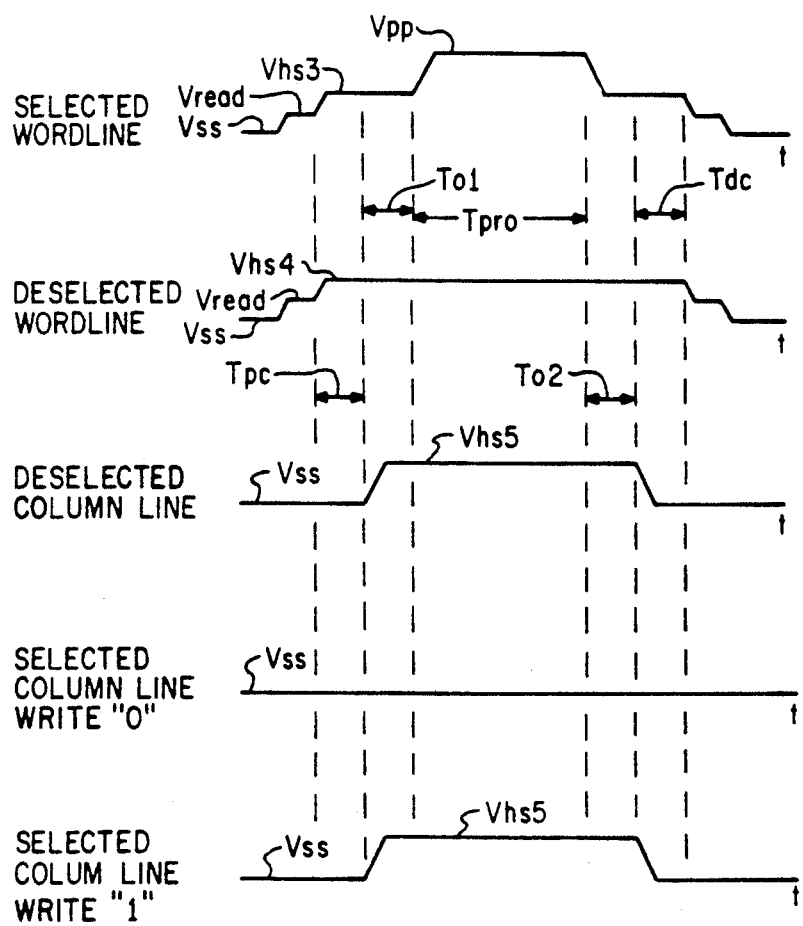
FIG. 5 is a representation of the timing sequence of programming voltages according to this invention.

Referring now to FIG. 5 in relation to FIGS. 1-4, it is assumed that first programming voltage Vss is applied to column lines 17 before the programming sequence begins. Some, or all, wordlines 15 may have a voltage such as Vread applied before the programming sequence begins. Both Vread and Vhs4 applied to deselected wordlines 15 are insufficient to cause tunnelling across the tunnel oxide such that the programmed state is changed. The programming sequence starts when the wordline decoder 16, in response to wordline address signals on lines 20r and to a signal from control circuit 21, places third preselected voltage Vhs3 (which may be the supply voltage of approximately +5 volts above Vss) on selected wordline 15, including selected control gate 14. Either before, after, or simultaneously, wordline decoder 16, in response to wordline address signals 20r and to a signal from control circuit 21, places fourth preselected voltage Vhs4 on deselected wordlines 15, including deselected control-gate conductors 14. The third and fourth preselected voltages Vhs3 and Vhs4 should be sufficiently close to the first programming voltage Vs that the floating-gate conductors 13 associated with the deselected wordlines 15 will not be programmed as a result, but should be sufficiently high that bitline stress will be reduced across any tunnelling windows of cells 10 in deselected wordlines 15, thereby avoiding deprogramming of pre-programmed cells 10.

After a pre-charge time interval Tpc, column decoder 18, in response to signals on lines 20d and to a signal from control circuit 21, places fifth preselected voltage Vhs5 (approximately +7 volts above Vss) on deselected source-column lines 17, including deselected source 11 regions within the array, to prevent unintentional programming of the deselected cells 10 common to the selected wordline 15.

After an optional time period Tol, wordline decoder 16, in response to wordline address signals on lines 20r and to a signal from control circuit 21, places second preselected voltage Vpp on selected wordline 15, including selected control gate 14. The programming voltage Vpp may be placed on the control-gate conductors 14 in a gradual manner so as to reduce voltageinduced stress on the selected cell 10. The drain-column lines 19 may be left floating. The floating gate 13 of the selected cell 10 is charged with electrons during programming, and the electrons in turn render the source-drain path under the floating gate 13 of the selected cell 10 nonconductive, a state which is read as a "zero" bit. Deselected cells 10 have source-drain paths under the floating gate 13 that remain conductive, and those cells 10 are read as "one" bits.

After a program time interval Tpro, wordline decoder 16, in response to wordline address signals on lines 20r and to a signal from control circuit 21, places a third preselected voltage Vhs3 on selected wordline 15, including selected control gate 14.

After an optional time interval To2, column decoder 18, in response to signals on lines 20d and to a signal from control circuit 21, places first preselected voltage Vss (which may be 0 volts) on deselected source-column lines 17, including deselected source 11 regions.

After a discharge time interval Tdc, the wordline decoder 16, in response to wordline address signals on lines 20r and to a signal from control circuit 21, may place either read voltage Vread or first preselected voltage Vss on all or some of wordlines 15, including control gates 14.

While the voltages of FIG. 5 are shown as straight line segments for illustration purposes, it is well-known that actual voltage-time plots have capacitive charge and capacitive discharge shapes.

For convenience, a table of read, write and prior-art erase voltages is given in the TABLE I below:

TABLE I

|  | Read | Write | Erase |
|---|---|---|---|
| Selected Wordline | 3-5 V | 16-18 V | −11 V |
| Deselected Wordlines | 0 V | Approx. 7 V | (None) |
| Selected Source Line | 0 V | 0 V | 5 V |
| Deselected Source Lines | Float | Approx. 7 V | (None) |
| Drain Lines | 1-1.5 V | Float | Float |

The voltages given as examples above are relative to a reference voltage taken, for example, as the voltage at selected cell source-column line 17b of the array. If, also for example, the voltage at selected wordline 15b of the array is the reference voltage, then the first programming voltage is −18 volts and the second programming voltage is 0 volts, with other voltages adjusted accordingly.

In summary, a novel method of programming an EEPROM cell has been shown and described. Although the illustrated cell has a floating gate integrated with a pass gate between the source and drain, the concept of this invention applies equally to cells without such pass gates.

While this invention has been described with respect to an illustrative embodiment, this description is not intended to be construed in a limiting sense. Upon reference to this description, various modifications of the illustrative embodiment, as well as other embodiments of the invention, will be apparent to persons skilled in the art. It is contemplated that the appended claims will cover any such modifications or embodiments that fall within the scope of the invention.

We claim:

1. A method for programming a selected memory cell in a semiconductor array of deselected cells and of said selected cell, said selected cell connected to at least a selected column line and a selected worline, each said deselected memory cell in said array connected to at least a deselected column line or a deselected wordline, said method comprising:

preselecting first, second, third, fourth and fifth programming voltages such that said second programming voltage is more positive than said first programming voltage and such that said third, fourth and fifth programming voltages are intermediate between said first and second programming voltages;

with said first programming voltage applied at least to said selected column line and each said deselected column line, applying said third programming voltage to said selected wordline and said fourth programming voltage to each said deselected wordline;

after a pre-charge time interval, applying said fifth programming voltage to each said deselected column line and applying said second programming voltage to said selected wordline;

after a program time interval, applying said third programming voltage to said selected wordline and applying said first programming voltage to each said deselected column line; and maintaining each said deselected wordline at said fourth programming voltage for a discharge time interval.

2. The method of claim 1, wherein, after said pre-charge time interval and after said fifth programming voltage is applied to each said deselected column line, said second programming voltage is applied to said selected wordline after a second pre-charge time interval.

3. The method of claim 1, wherein, after said program time interval and after applying said third programming voltage to said selected wordline, said first programming voltage is applied to each said deselected column line after an optional time interval.

4. The method of claim 1, wherein, after said pre-charge time interval, said fifth programming voltage is applied to each said deselected column line to prevent programming of said selected cell and wherein, after said program time interval, said first programming voltage is applied to said selected column line.

5. The method of claim 1, wherein said third and fourth programming voltages have the same value.

6. The method of claim 1, wherein said fourth and fifth programming voltages have the same value.

7. The method of claim 1, wherein said third and fifth voltages have the same value.

8. The method of claim 1, wherein said selected memory cell has a floating gate capacitively coupled to said selected column line and to said selected wordline and wherein said step of preselecting said first and second programming voltages comprises:

selecting said first programming voltage to be approximately 0 volts; and selecting said second programming voltage to be at a positive potential sufficient to cause electrons to flow from said selected column line to said floating gate.

9. The method of claim 1, wherein said selected memory cell has a floating gate capacitively coupled to said selected column line and to said selected wordline and wherein said step of preselecting said first and second programming voltages comprises:

selecting said first programming voltage to be approximately 0 volts; and selecting said second programming voltage to be approximately +18 volts.

10. The method of claim 1, wherein said third programming voltage is approximately 5 volts.

11. The method of claim 1, wherein said fourth programming voltage is in the approximate range of 7 to 10 volts.

12. The method of claim 1, wherein said fifth programming voltage is in the approximate range of 6 to 7 volts.

13. A method for preventing unintentional deprogramming of a deselected nonvolatile memory cell in an array of deselected cells and of a selected cell while programming said selected memory cell in said array, each said deselected memory cell in said array connected to at least a deselected column line or a deselected wordline, said selected cell connected to at least a selected column line and a selected wordline, said method comprising:

preselecting first, second, third, fourth and fifth programming voltages such that said second programming voltage is more positive than said first programming voltage and such that said third, fourth and fifth programming voltages are intermediate between said first and second programming voltages;

with said first programming voltage applied at least to said selected column line and each said deselected column line, applying said third programming voltage to said selected wordline and said fourth programming voltage to each said deselected wordline;

after a pre-charge time interval, applying said fifth programming voltage to each said deselected column line and applying said second programming voltage to said selected wordline;

after a program time interval, applying said third programming voltage to said selected wordline and applying said first programming voltage to each said deselected column line; and maintaining each said deselected wordline at said fourth programming voltage for a discharge time interval.

14. The method of claim 13, wherein, after said pre-charge time interval and after said fifth programming voltage is applied to each said deselected column line, said second programming voltage is applied to said selected wordline after a second pre-charge time interval.

15. The method of claim 13, wherein, after said program time interval and after applying said third programming voltage to said selected wordline, said first programming voltage is applied to each said deselected column line after an optional time interval.

16. The method of claim 13, wherein, after said pre-charge time interval, said fifth programming voltage is applied to each said deselected column line to prevent programming of said selected cell and wherein, after said program time interval, said first programming voltage is applied to said selected column line.

17. The method of claim 13, wherein said third and fourth programming voltages have the same value.

18. The method of claim 13, wherein said fourth and fifth programming voltages have the same value.

19. The method of claim 13, wherein said third and fifth voltages have the same value.

20. The method of claim 13, wherein said selected memory cell has a floating gate capacitively coupled to said selected column line and to said selected wordline and wherein said step of preselecting said first and second programming voltages comprises:

selecting said first programming voltage to be approximately 0 volts; and selecting said second programming voltage to be at a positive potential sufficient to cause electrons to flow from said selected column line to said floating gate.

21. The method of claim 13, wherein said selected memory cell has a floating gate capacitively coupled to said selected column line and to said selected wordline and wherein said step of preselecting said first and second programming voltages comprises:

selecting said first programming voltage to be approximately 0 volts; and selecting said second programming voltage to be approximately +18 volts.

22. The method of claim 13, wherein said third programming voltage is approximately 5 volts.

23. The method of claim 13, wherein said fourth programming voltage is in the approximate range of 7 to 10 volts.

24. The method of claim 13, wherein said fifth programming voltage is in the approximate range of 6 to 7 volts.

* * * * *